(12) United States Patent
Arndt et al.

(10) Patent No.: US 11,430,584 B2
(45) Date of Patent: Aug. 30, 2022

(54) DEVICE FOR DC CURRENT TRANSMISSION AND COOLING METHOD

(71) Applicant: Siemens Energy Global GmbH & Co. KG, Munich (DE)

(72) Inventors: Tabea Arndt, Erlangen (DE); Anne Bauer, Fuerth (DE); Jörn Grundmann, Grossenseebach (DE); Denis Steyn, Nuremberg (DE); Wolfgang Nick, Nuremberg (DE); Michael Tenzer, Nuremberg (DE); Peter Van Hasselt, Erlangen (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 618 days.

(21) Appl. No.: 15/574,885

(22) PCT Filed: Apr. 25, 2016

(86) PCT No.: PCT/EP2016/059184
§ 371 (c)(1),
(2) Date: Nov. 17, 2017

(87) PCT Pub. No.: WO2016/188688
PCT Pub. Date: Dec. 1, 2016

(65) Prior Publication Data
US 2018/0166188 A1  Jun. 14, 2018

(30) Foreign Application Priority Data
May 22, 2015  (DE) .................. 10 2015 209 432.4

(51) Int. Cl.
*H01B 12/16* (2006.01)
*H02G 15/34* (2006.01)
(Continued)

(52) U.S. Cl.
CPC ............ *H01B 12/16* (2013.01); *H01B 12/02* (2013.01); *H01B 12/14* (2013.01); *H01L 39/141* (2013.01); *H02G 15/34* (2013.01); *Y02E 40/60* (2013.01)

(58) Field of Classification Search
None
See application file for complete search history.

(56) References Cited

U.S. PATENT DOCUMENTS 3,735,018 A * 5/1973 Griesinger ............. H01B 12/14
174/28
8,897,845 B2 11/2014 Stemmle et al. ............. 505/163
(Continued)

FOREIGN PATENT DOCUMENTS

CA  2224272 A1  12/1996  ............. H01B 12/02
CN  1192287 A  9/1998  ............. H01B 12/02
(Continued)

OTHER PUBLICATIONS

Chinese Office Action, Application No. 201680029672.2, 19 pages, dated Oct. 9, 2018.
(Continued)

*Primary Examiner* — Paul A Wartalowicz
(74) *Attorney, Agent, or Firm* — Slayden Grubert Beard PLLC (57) ABSTRACT

The present disclosure relates to DC transmission. Some embodiments may include a device for DC transmission comprising: a superconducting transmission line including a superconducting conductor element; and a cooling device for cooling an inner region of the transmission line with a fluid coolant to a temperature below a critical temperature of the superconducting conductor element. The superconducting transmission line may comprise a vacuum-insulated sleeve thermally isolating the inner region of the transmission line from a warmer outer surrounding area. The cooling
(Continued)

device may comprise a feed device feeding coolant at an end region of the transmission line into the inner region of the transmission line. The transmission line may be free of internally arranged feed devices for feeding coolant at locations away from the end region.

20 Claims, 6 Drawing Sheets (51) Int. Cl.
*H01B 12/02* (2006.01)
*H01B 12/14* (2006.01)
*H01L 39/14* (2006.01)

(56) References Cited

U.S. PATENT DOCUMENTS

| | | | |
|---|---|---|---|
| 9,070,497 B2 | 6/2015 | Stemmle et al. | |
| 9,123,459 B2 | 9/2015 | Marzahn et al. | |
| 2004/0255452 A1 | 12/2004 | Schippl | 29/599 |
| 2005/0067174 A1 | 3/2005 | Suzawa et al. | 174/15.5 |
| 2008/0164048 A1* | 7/2008 | Hirose | H01B 12/06 174/15.5 |
| 2008/0190646 A1* | 8/2008 | Folts | H01L 39/16 174/125.1 |
| 2009/0247412 A1* | 10/2009 | Maguire | H01B 12/02 505/231 |
| 2014/0051582 A1* | 2/2014 | Schmidt | H01B 12/16 505/163 |
| 2014/0221213 A1 | 8/2014 | Fukuda | 505/163 |

FOREIGN PATENT DOCUMENTS

| | | | | |
|---|---|---|---|---|
| CN | 1496599 A | | 5/2004 | H01B 12/00 |
| CN | 1551249 A | | 12/2004 | H01B 1/00 |
| CN | 1317717 C | | 5/2007 | H01B 12/16 |
| EP | 0807938 | * | 11/1997 | |
| EP | 0807938 A1 | | 11/1997 | H01B 12/14 |
| EP | 2418747 A1 | | 2/2012 | H01B 12/16 |
| EP | 2685469 A1 | | 1/2014 | H01B 12/14 |
| EP | 2693584 A1 | | 2/2014 | H01B 12/14 |
| JP | 2009009908 A | | 1/2009 | H01B 12/16 |
| WO | WO009641352 | * | 12/1996 | |
| WO | 02/073767 A1 | | 9/2002 | H01B 12/00 |
| WO | 2016/188688 A1 | | 12/2016 | G01B 12/16 |

OTHER PUBLICATIONS

International Search Report and Written Opinion, Application No. PCT/EP2016/059184, 16 pages, dated Jul. 5, 2016.
German Office Action, Application No. 102015209432.4, 8 pages, dated Jun. 26, 2017.
Bartlit, J.R. et al., "Multiple Use of Cryogenic Fluid Transmission Lines," Published by IPC Science and Technology Press Ltd. "Proceedings of the Fourth International Cryogenic Engineering Conference", Eindhoven, pp. 177-180.
Laguna, N.P. et al., "An Efficiency Comparison of Superconducting Transmission with Other High Caracity Cable Systems," IEEE Transactions on Magnetics, vol. MAG-13, No. 1, 5 pages.
Chowdhuri, P. et al., "Bulk Power Transmission by Superconducting DC Cable," Electric Power Systems Research, 1, pp. 41-49.
Kobayashi, H. et al., "Feasibility of Self-stabilized Superconducting Cables Cooled with He II," IEEE Transactions on Magnetics, vol. 28, No. 1, pp. 723-726.
Schoenung, S. et al., "System Study of Long Distance Low Voltage Transmission Using High Temperature Superconducting Cable," EPRI Project Manager; WO8065-12, Final Report, 54 pages.
Grant, Paul M., "The SuperCable: Dual Delivery of Chemical and Electric Power," IEEE Transactions on Applied Superconductivity, vol. 15, No. 2, pp. 1810-1813.
Grant, Paul M., "Cryo-delivery systems for the CO-Transmission of Chemical and Electrical Power," Advances in Cryogenic Engineering: Transactions of the Cryog. Engng.Conf.—CEC, vol. 51, pp. 291-301.
Siemens, "High Voltage Direct Current Transmission—Proven Technology for Power Exchange," XP055184986, 48 pages.
Ding, Q.P. et al., "Fabrication of High-Performance (Ba,K)Fe2As2 Superconducting Wires by Powder-in-Tube Method," Physics Procedia 27, Elsevier B.V. Selection, pp. 272-275.
Grant, Paul M., "IASS Study Proposal: A Methane/Electricity ePipe Infrastructure to Socioeconomically and Enviro-responsibly service the Emerging Energy Needs of the European Union," 25 pages.

* cited by examiner

DEVICE FOR DC CURRENT TRANSMISSION AND COOLING METHOD

CROSS-REFERENCE TO RELATED APPLICATIONS

This application is a U.S. National Stage Application of International Application No. PCT/EP2016/059184 filed Apr. 25, 2016, which designates the United States of America, and claims priority to DE Application No. 10 2015 209 432.4 filed May 22, 2015, the contents of which are hereby incorporated by reference in their entirety.

TECHNICAL FIELD

The present disclosure relates to DC transmission. Various embodiments of the teachings herein may include a superconducting transmission line having at least one superconducting conductor element and/or a cooling device for cooling an inner region of the transmission line with the aid of a fluid coolant to a temperature below the critical temperature of the superconducting conductor element.

BACKGROUND

Transmission lines for are subject to loss in current transmission over long distances. When transmitting high electrical powers over relatively large distances, AC lines are unsuitable since the intrinsic inductance of the transmission lines leads to high AC losses. Therefore, for distances of above several tens of kilometers, DC transmission lines are better suited to transmitting relatively high electrical powers because of a lower level of loss. For DC transmission of this kind, an starting alternating current is usually rectified, transmitted as direct current, and then fed into the AC supply system once again by means of inverter stations.

The need for devices of this kind for transmitting high electrical powers over relatively long distances is increasing, in particular owing to the increasing connection load of regeneratively produced energy remote from the loads. To transmit these high powers, relatively high voltages are used for the DC transmission, for example rated voltages of 320 kV or 525 kV. One disadvantage of conventional, normally conducting lines is limited current-carrying capacity which leads to a plurality of lines laid in parallel to transmit the required power. This results in high costs and in some cases also a large space requirement. When embodied as overhead lines, the individual lines must be significantly separated to avoid voltage flashovers between them.

In the case of transmission by means of cable-connected conductors, the conductors within the cable have to be insulated from the surrounding area by means of dielectrics of sufficient dielectric strength. Insulated cables of this kind are typically used as submarine cables laid underwater and/or as cables laid underground. When copper is used as the conductor material, large conductor cross sections are required for transmitting large currents, and therefore, for example, submarine cables for powers of approximately 3 GW are often laid as isolated lines for bipolar transmission.

To configure lines for a high power range of this kind as a two-pole line with two jointly guided conductors may reduce costs. Normally conducting transmission lines for high-voltage DC transmission employ thick dielectric insulation layers required act in a thermally insulating manner at the same time. This insulation effect combined with the development of heat due to power losses heats up transmission lines of this kind to a great extent, and this can lead to damage to the materials, in particular to the insulation layer. The power transmitted by a transmission line is therefore often also limited by the heating of the conductor.

To solve the problem of the low current-carrying capacities of DC lines of this kind, DC lines with superconducting conductor elements can transport the current virtually without losses and with very high current density have been proposed. However, the superconducting conductor elements in lines of this kind are cooled by an additional cooling device to an operating temperature below the critical temperature of the superconductor. This operating temperature can lie, for example, between 4 K and 100 K, depending on the superconducting material selected. In known superconducting transmission lines, this cooling is achieved by the circulation of a fluid coolant in a closed circuit through the interior of the line.

In this case, intermediate cooling stations are used for relatively long line lengths of above 10 km in order to cool down the coolant which has heated up over a section of the line again and to feed said coolant into the interior of the line once again. In this case, the coolant flowing along the line length is heated up both by the thermal coupling to the surrounding area and also by mechanical friction and remaining electrical losses to such an extent that the required operating temperature of the superconductor can no longer be ensured with effect from a certain line length without interposed cooling stations of said kind. The use of intermediate cooling stations of this kind leads to a comparatively high level of expenditure on equipment. When laying the transmission lines overland or in the ground, the installation of intermediate cooling stations of this kind may possibly still be reasonable, but the use of relatively long superconducting transmission lines as submarine cables would be of absolutely no interest for both technical and economic reasons owing to the need for intermediate cooling stations of this kind in the region situated underwater.

SUMMARY

The teachings of the present disclosure may be embodied in a device for DC transmission which overcomes said disadvantages. In particular, some embodiments include a device of this kind which allows transmission of high electrical powers over relatively long distances with a low level of expenditure on equipment.

Some embodiments include a device (1) for DC transmission comprising: a superconducting transmission line (3) having at least one superconducting conductor element (5), and a cooling device (7) for cooling a radially inner region (9) of the transmission line (3) with the aid of a fluid coolant (11) to a temperature below a critical temperature of the superconducting conductor element (5). The superconducting transmission line (3) has a vacuum-insulated sleeve (13) for thermally isolating the inner region (9) of the transmission line (3) from a warmer outer surrounding area (15). The cooling device (7) comprises at least one feed device (17) for feeding coolant (11) at an end region (19a) of the transmission line (3) into the radially inner region (9) of the transmission line (3). The transmission line (3), given an axial longitudinal extent (21) of at least 20 km, is free of axially internally arranged feed devices for feeding coolant.

In some embodiments, the transmission line (3) has at least one coolant channel (25a, 25b), which surrounds the superconducting conductor element (5) in an annular manner, for transporting fluid coolant (11) along a longitudinal direction of the transmission line (3).

In some embodiments, the transmission line (3) has an electrically conductive line shield (29) which surrounds the superconducting conductor element (5) in an annular manner and an annular dielectric insulation layer (31) between the superconducting conductor element (5) and the line shield (29), wherein the dielectric insulation layer (31) comprises a fluid coolant (11). In some embodiments, the dielectric insulation layer (31) has a breakdown strength of at least 20 kV/mm.

In some embodiments, the dielectric insulation layer (31) for the most part comprises fluid coolant (11).

In some embodiments, the dielectric insulation layer (31) has at least one layer of a paper (31) which is embedded in coolant (11).

In some embodiments, the fluid coolant (11) is guided in the interior of a smooth-walled tube (35) at least over a major portion of the longitudinal extent of the transmission line in the interior of the transmission line (3).

In some embodiments, the superconducting conductor element (5) comprises a high-temperature superconducting material.

In some embodiments, the high-temperature superconducting material comprises magnesium diboride.

In some embodiments, the cooling device (7) has a feed device (17) for feeding coolant (11) only at one of the end regions (19a) of the transmission line (3).

In some embodiments, the transmission line has two fluidically isolated coolant channels (25a, 25b) for transporting the fluid coolant (11) in opposite directions (27a, 27b).

In some embodiments, the transmission line (3) is designed as a two-pole line with two superconducting conductor elements (5a, 5b), which are electrically insulated from one another, within a common vacuum-insulated sleeve (13).

In some embodiments, the transmission line (3) has two coolant channels (25a, 25b) which run coaxially in relation to one another.

In some embodiments, the fluid coolant (11) comprises nitrogen, hydrogen, helium, and/or neon.

Some embodiments include a method for cooling a superconducting conductor element (5) in a device (1) as described above to a temperature below its critical temperature, in which method the fluid coolant (11) is fed into the inner region (9) of the transmission line (3) only at one end region (19a) or two end regions (19a, 19b) of the transmission line (3).

BRIEF DESCRIPTION OF THE DRAWINGS

The teachings herein will be described below with reference to a few exemplary embodiments with reference to the appended drawings, in which.

DETAILED DESCRIPTION

In some embodiments, a device for DC transmission has a superconducting transmission line having at least one superconducting conductor element, and a cooling device for cooling a radially inner region of the transmission line with the aid of a fluid coolant to a temperature below the critical temperature of the superconducting conductor element. The superconducting transmission line has a vacuum-insulated sleeve for thermally isolating the inner region of the line from a warmer outer surrounding area. Furthermore, the cooling device comprises at least one feed device for feeding coolant at an end region of the line into the inner region of the transmission line. The line has a longitudinal extent of at least 20 km and is free of axially internally arranged feed devices for feeding coolant over this length.

In other words, the transmission line has feed devices of this kind only at most at its two ends. No feed devices for feeding coolant into an interior of the line are arranged in the axially inner regions, that is to say in the entire central region in the longitudinal direction between the two end regions of the line. Therefore, there can be, for example, either only one single feed device at only one end of the line, or there can be feed devices at the two ends of the line in total.

The superconducting conductor element is thermally sufficiently isolated from the outer surrounding area by the vacuum-insulated sleeve and the electrical losses and mechanical friction losses are kept sufficiently low in order to avoid intermediate cooling stations on internal sections of the line. Owing to the thermal isolation and the low losses, the superconducting conductor element is kept at an operating temperature below the critical temperature of the superconductor owing to the cooling effect of the fluid coolant over the entire length of the line. A superconducting transmission line of this kind can be used underwater as a submarine cable in this case. In some embodiments, the line can also be laid underground and/or overland. The use as a submarine cable over lengths of more than 10 km is made possible in the first place by the design described herein.

In comparison to devices for DC transmission with normally conducting transmission lines, a very high current-carrying capacity can be achieved. As a result, it is possible to transmit high powers even in medium-voltage ranges. Furthermore, high powers can be transmitted via a two-pole line in which two superconducting conductors are guided jointly within one vacuum insulation.

In some embodiments, a method for cooling a superconducting conductor element in a device of this kind to a temperature below its critical temperature is characterized in that the fluid coolant is fed into the inner region of the line only at one end region or two end regions of the line. The advantages of the method are produced in an analogous manner to the advantages of the device.

The transmission line may have a longitudinal extent of at least 50 km, in particular at least 100 km, and can be free of axially internally arranged feed devices over this length.

In some embodiments, the transmission line may include a coolant channel which surrounds the superconducting conductor element in an annular manner, for transporting fluid coolant along the longitudinal direction of the line. Therefore, the coolant can be transported in a simple manner from a first line end, which has a feed device, to a second line end and, in the process, effectively cool the internal region of the transmission line over the length of said transmission line.

Owing to the arrangement surrounding the conductor on the outside in an annular manner, the coolant channel can at the same time serve to provide thermal and/or electrical insulation from the outer surrounding area here. In other words, the fluid coolant which is transported in the coolant channel acts as a dielectric insulation layer of the transmission line at the same time.

In some embodiments, the transmission line may include an electrically conductive line shield which surrounds the superconducting conductor element in an annular manner and an annular dielectric insulation layer between the superconducting conductor element and the line shield, wherein the dielectric insulation layer comprises fluid coolant. In general, "annular" structures are structures of the kind which, in cross section of the line, surround the regions, which are situated further on the inside, in an annular manner and which extend along the longitudinal direction of the line as long, hollow-cylindrical structures. They can extend, in particular, over the entire length of the line. The annular line shield can, in principle, be of normally conducting and/or superconducting design. By way of example, the line shield can have a metal conductor, e.g. copper or aluminum. In some embodiments, the line shield may include a continuous, homogeneous cylindrical layer, or it can be wound onto the elements of the line, which are situated further on the inside, as a strip or braid of electrical conductors. In some embodiments, said line shield is isolated from the conductor element at least by said coolant channel and can be the first, that is to say furthest inner, line shield as seen from the conductor element.

In some embodiments, the dielectric insulation layer is arranged radially between the conductor element and the line shield and may be formed at least partially by fluid coolant. This coolant may include the coolant flowing in an annular coolant channel in the longitudinal direction of the line and fed in from one end of the line. In the event of a voltage flashover, that portion of the insulation layer which is formed by the fluid coolant is not permanently destroyed, in contrast to a solid body dielectric, since said portion can be replaced by coolant which flows in afterward. A design of this kind with the coolant as a portion of the insulation layer is suitable particularly for DC transmission in the medium-voltage range, with voltages of between 10 kV and 123 kV for example, since, for example, liquid nitrogen and liquid hydrogen are sufficiently resistant to flashovers in this voltage range. The use for DC transmission in the voltage range of between 10 kV and 36 kV is particularly preferred.

In some embodiments, in which the coolant constitutes at least a portion of the dielectric insulation layer between the conductor element and the line shield, may include a transmission line with a length of below 20 km. The described double effect of the coolant in the annular coolant channel can achieve efficient cooling together with a high breakdown strength of the transmission line for relatively short lines of said kind too.

In some embodiments, the dielectric insulation layer may have a breakdown strength of at least 20 kV/mm. Therefore, it can be designed to be resistant to flashovers such that DC transmission given voltages of over 1 kV and/or transmission powers of above 500 MW is possible with the device, without voltage flashovers occurring between the conductor element and the line shield. The transmission power with a superconducting conductor element may even be above 3 GW. The current transmitted by each conductor element may be at least 5 kA, in particular at least 10 kA, irrespective of whether the transmission line is a single-pole or multipole transmission line.

In some embodiments, the dielectric insulation layer may comprise fluid coolant. In some embodiments, a major portion of the volume of the insulation layer is the fluid coolant. By way of example, the dielectric insulation layer can be formed substantially by the annular coolant channel which is filled with coolant, wherein the hollow-cylindrical channel can have, in addition to the coolant, additional electrically insulating supporting elements for supporting the elements of the line which are situated further on the inside. In some embodiments, the transmission line has radially continuous axial segments and/or azimuthal segments in which the dielectric insulation layer is formed entirely by fluid coolant. The supporting elements which are optionally present between said segments can be formed in a web-like manner. They can be formed, for example, from stainless steel, glass fiber-reinforced plastic and/or cast resin.

In some embodiments, the dielectric insulation layer may include at least one layer of a paper embedded in coolant. In particular, fluid coolant can flow around the paper. The paper may comprise polypropylene-laminated paper (PPLP for short) which is particularly resistant to flashovers. A PPLP layer of this kind may comprise a laminate of a polypropylene film adjoined by cellulose paper on both sides. The dielectric insulation layer may include a stack of a plurality of papers of this kind, wherein fluid coolant flows around each of the individual paper layers.

In some embodiments, the paper can be arranged either in a main coolant channel of the line, or the coolant can, in parallel to its flow in a main coolant channel, flow around the paper additionally in a parallel second coolant channel. For an annular coolant channel, in which paper around which coolant flows is used for dielectric insulation, additional web-like supporting structures for the elements which are situated further on the inside can advantageously be omitted, and the line can be designed to be mechanically more robust overall than when the inner elements are suspended by means of separate supporting structures.

If the dielectric insulation layer is formed by a combination of PPLP and the fluid coolant, particularly high breakdown strengths may be achieved and the device for DC transmission can be operated, for example, at rated voltages of above 100 kV, in particular of above 320 kV. Rated voltages of this kind may be more difficult with a dielectric insulation layer which is formed only by fluid coolant at least in partial segments since, for example, the flashover voltage of liquid nitrogen or liquid hydrogen does not increase in a linear manner with the flashover distance: given twice the flashover distance, the dielectric strength increases only approximately by a factor of 1.6. Therefore, the flashover distance would have to increase in an over proportional manner in the event of an increasing rated voltage in the case of insulation only by means of the fluid coolant, this at the same time increasing the inhomogeneity of the electrical field and, in turn, leading to local increases in field strength and therefore to yet larger flashover distances. Therefore, an insulation layer comprising a combination of a paper laminate and fluid coolant may be more useful for relatively high voltage ranges.

In some embodiments, the fluid coolant can be guided in the interior of a smooth-walled tube at least over a major portion of the longitudinal extent of the line in the interior of the transmission line. Here, a smooth-walled tube means a tube of said kind which has no regular, superordinate structure besides the natural production-related roughness of its surface. In particular, a smooth-walled tube does not include a corrugated tube, at least in said major portion.

As used herein, the amplitude of a surface structure perpendicular to the local surface of the tube may be less than the wall thickness of the outer boundary wall of the tube in each case. This design has the effect that the flow resistance for the coolant to be transported is kept low and eddying of the coolant is minimized. As a result, a sufficiently high mass throughput of the coolant in order to ensure the cooling power which is required over the line length, even in a low pressure range, can be achieved. Secondly, heating up owing to mechanical friction losses which are associated with eddying can be kept low. Furthermore, the thermally active surface is reduced in comparison to lines with a corrugated outer sleeve in the case of lines which are vacuum-insulated with smooth tubes, this in turn reducing the requirements made in respect of cooling power. These features may contribute to cooling of the conductor over particularly long line lengths without additional axial inner intermediate cooling stations being required. The coolant channel may be bounded by a smooth-walled tube over the entire length of the transmission line.

Smooth-walled coolant tubes may have, however, low mechanical flexibility which matters when laying the transmission line. This can be compensated for by laying comparatively relatively short segments with corrugated boundary tubes arranged between individual segments of smooth-walled boundary tubes. In this manner, a relatively high degree of mobility of the line can be possible by bending at predetermined points. The arrangement of segments of this kind with corrugated coolant tubes may also help with length compensation of the line, for example, owing to thermal expansion or shrinkage. In some embodiments, the eddying in these corrugated segments can nevertheless be kept low by lining a corrugated outer coolant tube with an inserted smooth tube piece, so that coolant flowing in the interior of this smooth tube piece, for its part, experiences only a low level of eddying.

In some embodiments, the superconducting conductor element may comprise a high-temperature superconducting material. High-temperature superconductors (HTS) are superconducting materials with a critical temperature of above 25 K and, in the case of some material classes, for example cuprate superconductors, of above 77 K, in which the operating temperature can be achieved by cooling with cryogenic materials other than liquid helium. HTS materials are therefore also attractive since these materials can have very high critical current densities, depending on the operating temperature selected.

In some embodiments, the high-temperature superconducting material can comprise magnesium diboride. The conductor element may contain magnesium diboride as the main constituent part or can even substantially comprise magnesium diboride. Magnesium diboride has a critical temperature of approximately 39 K and is therefore a high-temperature superconductor, however the critical temperature is rather low in comparison to other HTS materials. In comparison to oxide ceramic high-temperature superconductors, the ability to produce said material is simple and therefore cost-effective. Magnesium diboride-based conductors can be produced particularly easily and expediently by aerosol deposition or by the so-called powder-in-tube method.

In some embodiments, the conductor element may comprise other high-temperature superconducting materials, for example second-generation HTS materials, that is to say compounds of the type $REBa_2Cu_3O_x$ (REBCO for short), where RE is a rare-earth element or a mixture of elements of this kind. On account of their high critical temperatures, REBCO superconductors can also be cooled with liquid nitrogen and have a particularly high current-carrying capacity, primarily at temperatures of lower than 77 K.

Other useful materials may include first-generation HTS materials, for example the different variants of bismuth strontium calcium copper oxide. As an alternative, superconducting pnictides can also be used. On account of their rather low critical temperature, superconducting pnictides are suitable for an operating temperature of approximately 20 to 30 K.

In some embodiments, the cooling device may include a device for feeding coolant only at one of the end regions of the line. In other words, the coolant fed in from one end is sufficient for cooling the conductor to its operating temperature over the entire length of the line. In this case, the line can have only one coolant channel in which the coolant is transported only in one direction, specifically from the feed end to the other end of the line. In some embodiments, the line may have two coolant channels by means of which the coolant can be transported back to the line end with the feed device again in the form of a closed circuit. In this case, the two coolant channels may be connected to one another at the opposite end.

In some embodiments, the transmission line can have two fluidically isolated coolant channels for transporting the fluid coolant in the opposite direction. In any case, the device may include a closed coolant circuit including two coolant channels which are guided in one transmission line. Coolant may circulate in the forward and return direction with the same degree of mass transport by means of said closed coolant circuit. In some embodiments, a closed circuit of this kind may include coupling two lines laid in parallel and which for example each have only one coolant channel and of which one is used for forward transport and the other is used for return transport of the coolant.

In some embodiments, there are two fluidically isolated coolant channels in one transmission line. Said coolant channels can be interleaved in one another or can run next to one another. In the case of an interleaved design, said coolant channels may be arranged in a coaxial manner. In some embodiments, two inner eccentric coolant channels can also be arranged within one outer coolant channel.

In some embodiments, the transmission line may comprise a two-pole line with two superconducting conductor elements electrically insulated from one another within a common vacuum-insulated sleeve. With said transmission line, direct current can be transmitted by means of only one single two-pole line, this leading to savings in respect of the materials and the laying of the line in comparison to the use of two single-pole lines. Embedding the two conductor elements into a common line is possible because of the high breakdown strength of the described dielectric insulation layers, in particular using the coolant as insulator. The arrangement of the two conductor poles in a jointly vacuum-insulated line also reduces the thermal losses which occur overall and therefore the expenditure on cooling since the overall surface of the line, which is effective in respect of the thermal losses, is smaller in comparison to a design with two separately vacuum-insulated lines. The arrangement of two poles in a jointly vacuum-insulated line sleeve may be used in the case of rated voltages of up to approximately 123 kV in particular since, in this range, electrical insulation can be achieved by means of the coolant in a particularly simple manner. In some embodiments, the two conductor elements of a two-pole line of this kind can be guided, in principle, either next to one another or coaxially interleaved in one another.

In some embodiments, the transmission line may comprise two coolant channels which run coaxially in relation to one another. As described above, said coolant channels can be designed to transport coolant in opposite directions. However, in principle, the coolant can also be transported in the same direction in both channels. In this case, the return transport can be performed, for example, in another transmission line, or net mass transport of the coolant in the given transportation direction can also take place. The two concentrically running coolant channels can, for example, also be filled with different fluid coolant.

In some embodiments, two interleaved coolant channels allow a first inner coolant channel to be operated with a lower mass throughput than in the case of conventional lines since the coolant can absorb the majority of the thermal load occurring from the outside, in particular the thermal radiation, in the outer, second coolant channel. This causes only a slight increase in the temperature of the coolant in the inner coolant channel over the length of the line, and the superconducting conductor element can be kept at a temperature below its critical temperature over the entire line length. Here, a considerably higher temperature can be permitted for the outer coolant channel than for the inner coolant channel. When fresh, cooled-down coolant is fed in at only one end of the transmission line, this embodiment is therefore particularly suitable for transporting the coolant which is heated up over the length of the line out of the inner channel in the outer coolant channel back to the cooling device and feed device. The inner and the outer coolant channel may be thermally insulated from one another by an additional vacuum-insulating sleeve.

In some embodiments, the fluid coolant may comprise nitrogen, hydrogen, helium, and/or neon. In some embodiments, the coolant can consist entirely of one of these substances. In general, the coolant can be present in the liquid, gaseous, and/or supercritical state here. In this case, the choice of coolant can be matched to the desired operating temperature of the selected superconductor. By way of example, second-generation HTS materials can be effectively cooled with liquid nitrogen, whereas magnesium diboride can be cooled with liquid or supercritical hydrogen. The use of a supercritical coolant, in particular supercritical hydrogen, may be used to avoid the formation of bubbles by boiling of the coolant in the coolant channel. Therefore, the dielectric strength when using the coolant as dielectric insulation means is increased. The operating temperature of the superconducting conductor element can, for example, be between 20 and 35 K in the case of cooling with hydrogen or between 65 and 80 K in the case of cooling with nitrogen.

In some embodiments, in addition to the vacuum-insulated sleeve, the inner region of the transmission line can be thermally shielded from the outer surrounding area by a multilayer superinsulation. This superinsulation can be arranged, for example, within the vacuum-insulated sleeve. In some embodiments, superinsulation of this kind can also be provided in other radial positions.

In some embodiments, the line shield can be arranged as a separate electrically conductive layer within the vacuum-insulated sleeve or it can be designed as part of the vacuum-insulated sleeve. For this purpose, an electrically conductive inner wall of the vacuum-insulated cryostat can be used as the line shield for example.

In some embodiments, the coolant channel may be arranged between the electrical conductor and the line shield in order to use the coolant flowing in the coolant channel as a dielectric insulation layer at the same time. In some embodiments, a coolant channel can also be arranged between the line shield and the vacuum-insulated sleeve. As described above, an additional outer coolant channel of this kind can serve to additionally thermally shield an inner coolant channel from the warm outer surrounding area.

In some embodiments, the pressure in the coolant channel or the coolant channels of the line may be effective without the pressure exceeding 20 bar, e.g., 5 bar. The described design with coolant transport in predominantly smooth tubes allows sufficient cooling of the inner regions of the line with coolant feed in this pressure range.

In some embodiments, a method for cooling the superconducting conductor element allows the transmission line to be used for mass transport of the coolant along the longitudinal direction of the line. For this purpose, a quantity of the coolant which is transported along a first direction of the transmission line can be larger than a quantity which is transported in an opposite second direction of the line. This embodiment of the method can be useful particularly when the superconducting transmission line is in addition to DC transmission also intended to be used for transporting hydrogen which is obtained by electrolysis. As a result, the power which is transmitted by the line overall in the form of electrical and chemical energy can be considerably increased in comparison to pure current transmission.

Figure 1:
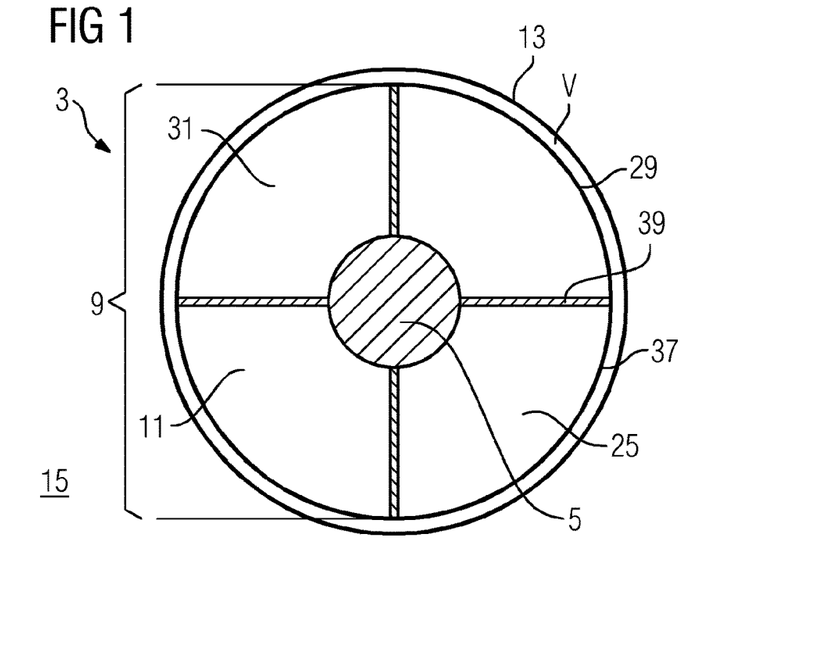
FIG. 1 shows a schematic cross section through a transmission line according to a first exemplary embodiment.

FIG. 1 shows a schematic cross section through a transmission line 3 of a device for DC transmission according to a first exemplary embodiment. Said figure shows a superconducting conductor element 5 arranged in the center of the line 3 and can have, for example, a superconducting wire or a normally conducting or non-conducting substrate with a high-temperature superconducting layer. Here, the superconducting conductor element 5 can be constructed from different materials and have different conductor forms. It can, for example, also be composed of a plurality of filaments of individual superconducting conductors. The superconducting material of the superconducting conductor element 5 is cooled by a fluid coolant 11 which flows in a coolant channel 25 which surrounds the conductor element 5 in an annular manner. The fluid coolant 11 may be, for example, liquid nitrogen or liquid or supercritical hydrogen which is cooled down to a cryogenic temperature in a cooling unit arranged outside the line 3 and which is fed from one end of the line 3 into a radially inner region 9. The superconducting conductor element 5 is cooled to an operating temperature below the critical temperature of the superconductor by the fluid coolant 11.

The superconducting conductor element 5 is held in the center of the line 3 by supporting elements 39, as a result of which a minimum distance from the outer sleeve of the line is ensured all around the conductor element 5. The coolant channel 25 is surrounded radially on the outside by a vacuum-insulated double-walled sleeve 13 which provides for thermal insulation of the radially inner region 9 from a warmer outer surrounding area 15. The vacuum-insulated sleeve 13 therefore acts as a cryostat for the inner regions of the line. In this example, at least the cryostat inner wall 37 has an electrically conductive material and at the same time acts as a line shield 29. A dielectric insulation layer 31 is arranged radially between the superconducting conductor element 5 and the line shield 29, said dielectric insulation layer being formed in this example by the flowing coolant 11 and the web-like electrically insulating supporting elements 39 which are arranged at specific points. Said dielectric insulation layer 31 has, overall, a sufficiently high breakdown strength for a rated voltage of the transmission line 3 in the device for DC transmission.

Figure 2:
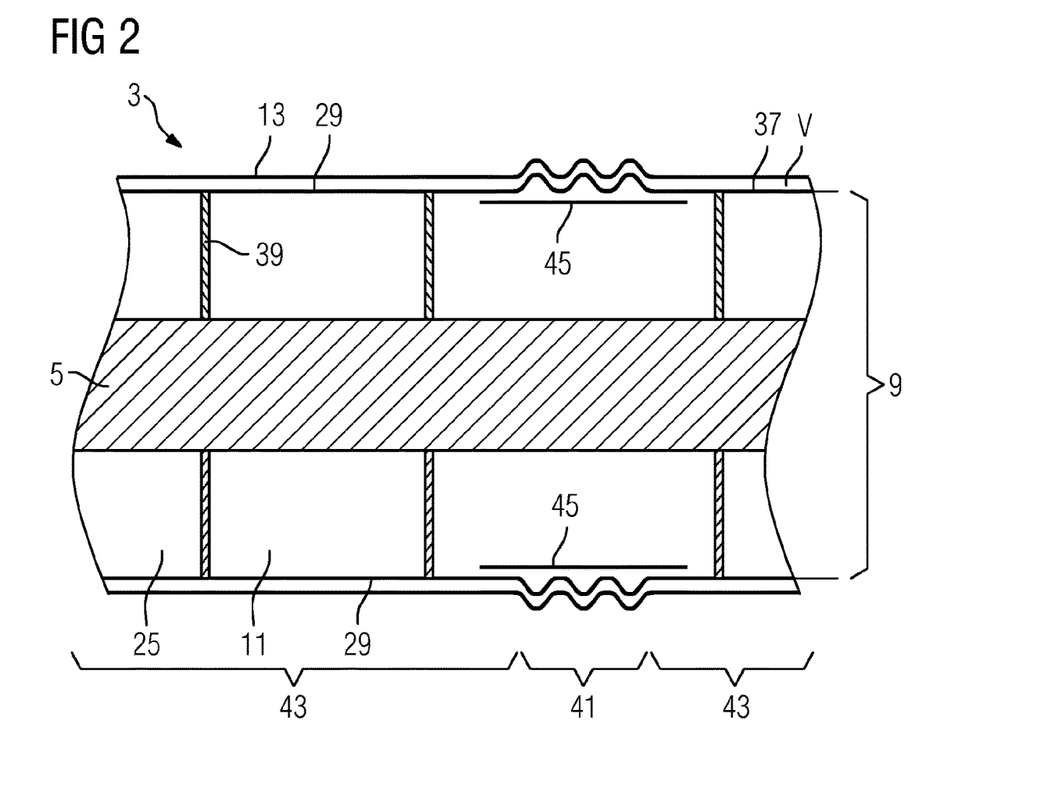
FIG. 2 shows a schematic longitudinal section through a transmission line according to a second exemplary embodiment.

FIG. 2 shows a schematic longitudinal section through a transmission line 3 of a device for current transmission according to a second exemplary embodiment. The line 3 can be constructed, for example in cross section, in a similar manner to the line shown in FIG. 1. The longitudinal section of FIG. 2 shows that the vacuum-insulated sleeve 13 has a corrugated cryostat inner wall 37 over a major portion of a longitudinal extent of the line 3. The vacuum-insulated sleeve 13 is formed as a smooth, non-corrugated tube in the two sections 43. This may be the case over the entire length of the transmission line. However, the line can optionally also have one or more corrugated segments 41, as illustrated in FIG. 2. The vacuum-insulated sleeve has an undulating profile in these corrugated segments, this increasing a mechanical flexibility of the line both in respect of expansion or compression and in respect of bending in said region. To nevertheless achieve a flow resistance which is as low as possible and eddying of the coolant 11 flowing in the coolant channel 25 which is as low as possible, the cryostat inner wall 37 is lined on the inside with a smooth-walled tube insert 45 in these segments.

Figure 3:
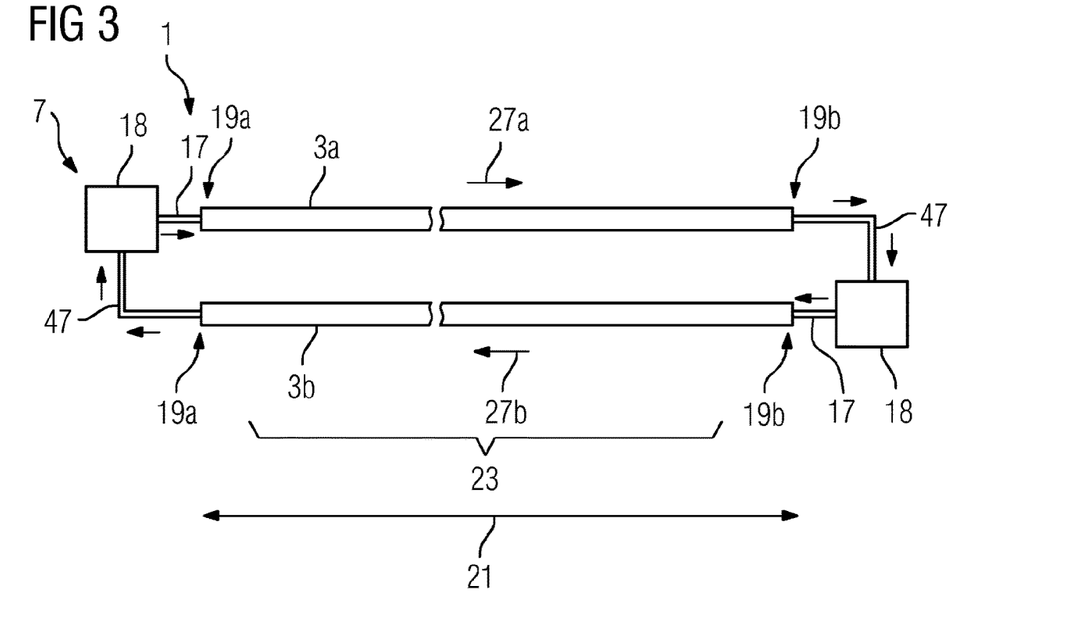
FIG. 3 shows a basic diagram of a device for current transmission according to a third exemplary embodiment.

FIG. 3 shows a basic schematic diagram of a device for DC transmission according to a third exemplary embodiment. Said device 1 has two transmission lines 3a and 3b which can be constructed, for example, in a similar manner to that shown in FIGS. 1 and 2. In particular, these two lines can each comprise a single-pole line with in each case only one electrical conductor run. Two-pole DC transmission is made possible owing to the use of the two lines for current transmission. The device for current transmission has a cooling device 7 with, in this example, two isolated cooling units 18 in which the fluid coolant 11 is cooled down again after being heated up in the cooling channels of the lines. Each of the transmission lines has a total length 21 of at least 20 km.

Each of the two lines 3a and 3b has, at one of its two ends, a device 17 for feeding coolant which has been cooled down by one of the cooling units 18 into the radially inner region of the respective line. In the example shown, each of the two lines 3a and 3b has only one feed device 17 of this kind, said feed device being arranged at the first end region 19a for the line 3a and being arranged at the opposite second end region 19b for the line 3b. The two lines do not have any such feed devices in the axially inner region 23 or at the respectively opposite line ends. In this example, the fluid coolant 11 circulates in a closed circuit by means of the coolant channels of the two lines 3a and 3b, the two cooling units 18 and the coolant tubes 47 and feed devices 17 arranged therebetween. The flow directions 27a and 27b of the coolant in the two lines oppose one another for this purpose. The thermal insulation of the radially inner regions 9 of the lines 3a and 3b has the effect that their respective superconducting conductor elements are kept at an operating temperature below the critical temperature of the superconductor over the entire longitudinal extent 21 of the lines.

Figure 4:
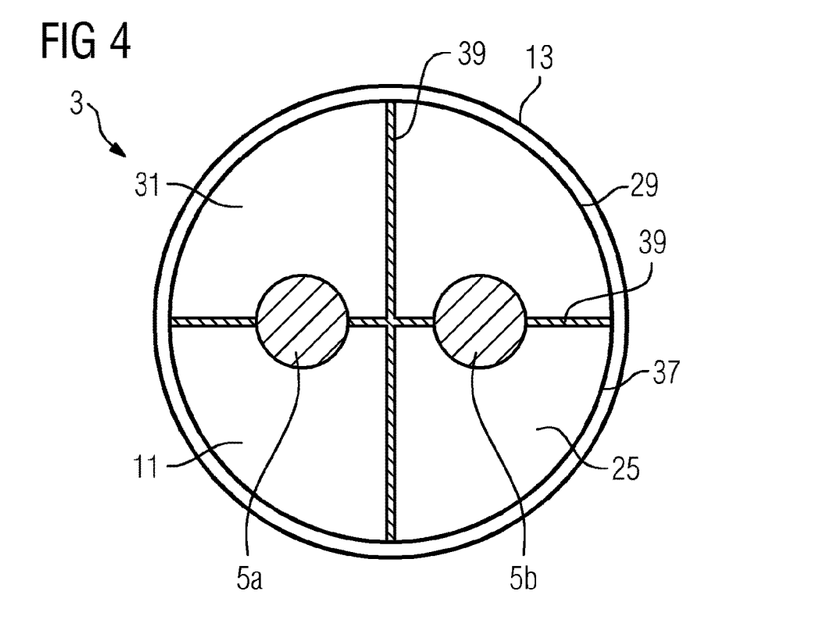
FIG. 4 shows a schematic cross section through a transmission line according to a fourth exemplary embodiment.

FIG. 4 shows a schematic cross section through a transmission line 3 for a device for current transmission according to a fourth exemplary embodiment. Said figure shows a two-pole line 3 with two isolated superconducting conductor elements 5a and 5b which are electrically insulated from one another. Otherwise, the line 3 is constructed in a similar manner to the single-pole lines shown in FIGS. 1 and 2. The two conductor elements 5a and 5b are also supported here against one another and against the vacuum-insulating sleeve 13 by web-like supporting elements 39. As shown in FIG. 4, these supporting structures 39 can jointly support the two conductor elements 5a and 5b. In some embodiments, separate supporting structures can also be provided for the two conductor elements. In general, arranging the two conductor elements as symmetrically as possible with respect to a central axis of the line may be useful. The conductor elements 5a and 5b are each surrounded by a dielectric insulation layer 31 which electrically insulates the conductor elements from one another and from the outer line shield 29 in the fourth exemplary embodiment too. Said insulation layer 31 is, for its part, formed for the most part by the coolant 11 flowing in the coolant channel 25 in cooperation with the electrically insulating supporting elements 39. A two-pole transmission line 3 of this kind can be used to transmit direct current in a device with only one single line of this kind.

In some embodiments, as an alternative to a two-pole line of this kind, a simple, single-pole line as in FIGS. 1 and 2 can also be used to transmit direct current. Since superconducting transmission lines can be operated primarily in the medium- and high-voltage range in the case of very high rated currents, a single-pole line with twice the rated current can also be used instead of a two-pole line, and the return conductor with the opposite current flow direction can be formed, for example, by ground, water and/or a low-voltage line.

Figure 5:
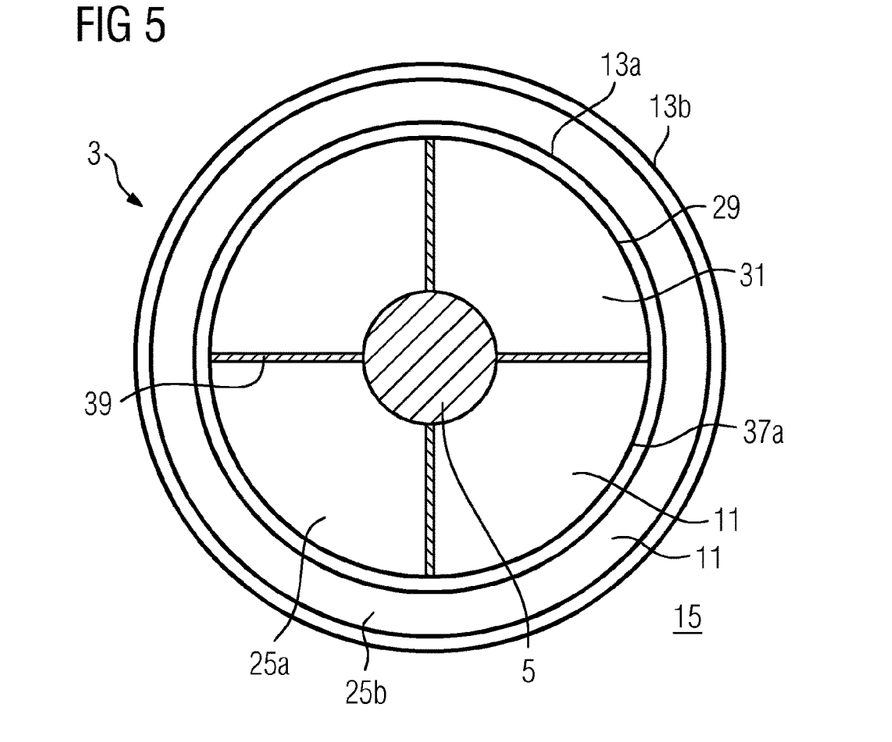
FIG. 5 shows a schematic cross section through a transmission line according to a fifth exemplary embodiment.

FIG. 5 shows a schematic cross section through a transmission line 3 for a device for current transmission according to a fifth exemplary embodiment. Said figure shows a single-pole line with only one superconducting conductor element 5, in a similar manner to that shown in FIG. 1. However, in contrast to said FIG. 1, the transmission line shown in FIG. 5 has two coolant channels, of which the first coolant channel 25a is arranged between the conductor element 5 and the line shield 29 in a similar manner to that in the first exemplary embodiment. The line shield 29 is, for its part, formed as a cryostat inner wall 37a of an inner vacuum-insulated sleeve 13a. In the line according to the fifth exemplary embodiment, said inner vacuum-insulated sleeve is surrounded by a second annular coolant channel 25b which, for its part, is surrounded by an annular outer vacuum-insulated sleeve 13b. Said arrangement of two concentric coolant channels 25a and 25b has the effect that the inner conductor element 5 is particularly effectively thermally insulated against the warm outer surrounding area 15. Here, the flow direction in the two coolant channels 25a and 25b can, in principle, both be the same and/or can oppose one another. An opposite flow direction may allow a closed circuit of the coolant to thereby be made possible by means of a single line in a simple manner.

Figure 6:
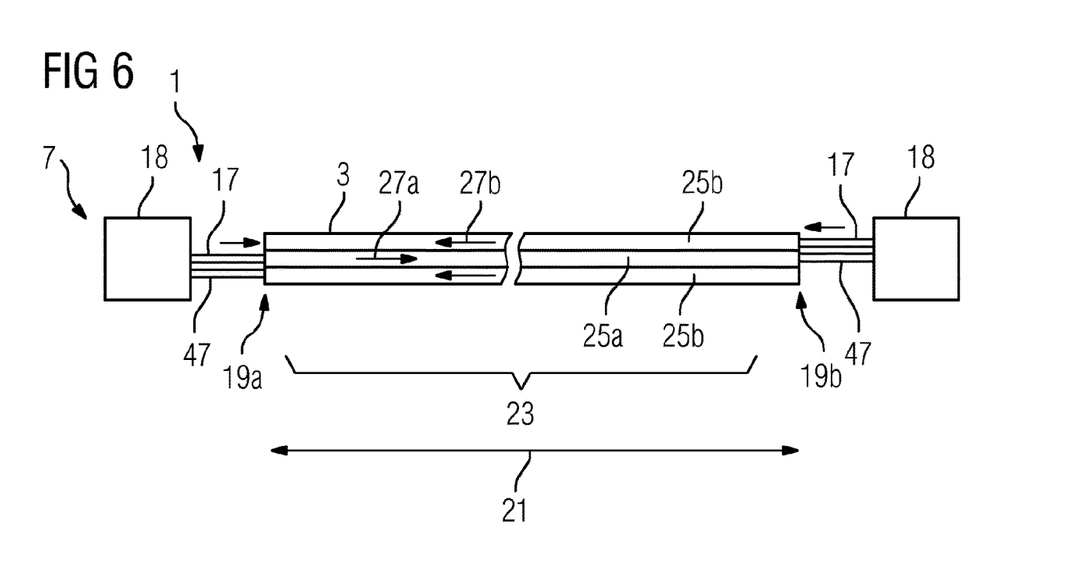
FIG. 6 shows a basic diagram of a device for current transmission according to a sixth exemplary embodiment.

FIG. 6 shows a basic schematic diagram of a device 1 for current transmission according to a sixth exemplary embodiment. Said device has a single transmission line 3 which can be constructed, for example, in a similar manner to that shown in FIG. 5 as a single-pole line with two concentric coolant channels 25a and 25b. In some embodiments, the line may comprise a two-pole line with two concentric coolant channels 25a and 25b. Therefore, said transmission line can be a transmission line which has two inner conductor elements 5a and 5b, in a similar manner to that shown in FIG. 4, but which are surrounded, analogously to FIG. 5, by two concentric vacuum-insulated sleeves 13a and 13b and two concentric coolant channels 25a and 25b. In some embodiments, the transmission line has a first coolant channel 25a for transporting the coolant along a first flow direction 27a and a second coolant channel 25b for transporting the coolant along an opposite second flow direction. The device for current transmission 1 has, for its part, a cooling device 7 which, in this example, also comprises two cooling units 18 for cooling the fluid coolant 11 which was heated in the line interior. Said two cooling units are arranged in the region of the two opposite line ends 19a and 19b. Each of these line ends has a feed device 17 for feeding coolant into an inner region of the line. Here, one feed device 17 is fluidly connected to the inner coolant channel 25a at the first end region 19a and the other feed device 17 is fluidically connected to the outer coolant channel 25b at the second end region 19b. Owing to said countercurrent principle, firstly a closed circuit can be formed over the length 21 of the line, and secondly a relatively uniform temperature distribution over the length 21 of the line is achieved owing to the renewed cooling by means of the cooling units 18 at the two ends. This is achieved without additional cooling units and feed devices in the axially inner region 23 of the line.

Figure 7:
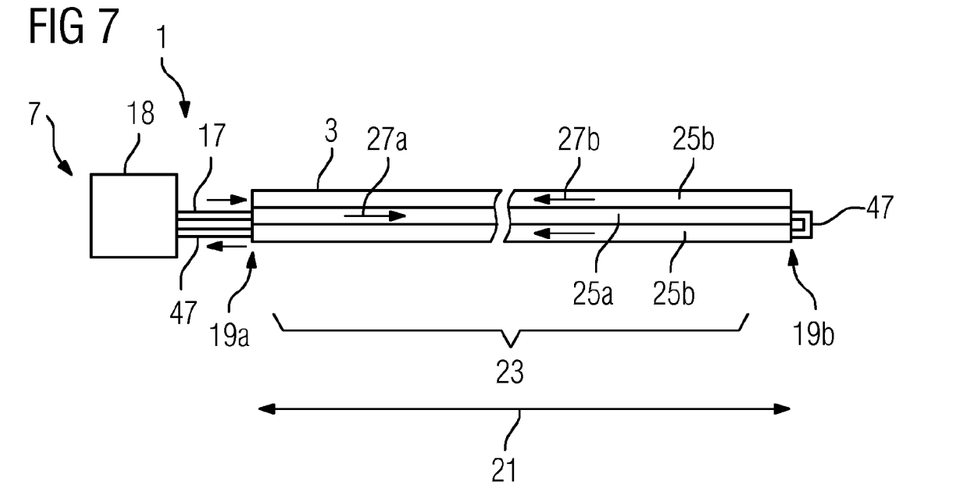
FIG. 7 shows a basic diagram of a device for current transmission according to a seventh exemplary embodiment.

FIG. 7 shows a basic diagram of an alternative device 1 for DC transmission according to a seventh exemplary embodiment. Said figure shows a device with only one single line 3 which, for its part, can be designed either as a single-pole or as a two-pole line. In a similar manner to that shown in FIG. 6, said line also has two concentric coolant channels 25a and 25b. However, in contrast to the example of FIG. 6, a feed device 17 for feeding coolant 11 into the interior of the line is arranged only at the first end region 19a of the line here. In the example shown, the coolant is first fed into the inner coolant channel 25a here, so that the relatively cool coolant flows along closer to the inner conductor element 5. However, the order of flow through the two coolant channels 25a and 25b can also be reversed in principle. The inner coolant channel 25a is fluidically connected to the outer coolant channel 25b at the opposite second end region 19b, so that a closed coolant circuit is also produced here, but in this example without a second feed device. As shown in FIG. 7, the fluidic connection can be created by means of an external coolant tube 47; as an alternative, it can also be created in the interior of the line by an opening between the two coolant channels. It is only essential that the two coolant channels are connected to one another in an end region which is situated opposite the feed device 17.

Figure 8:
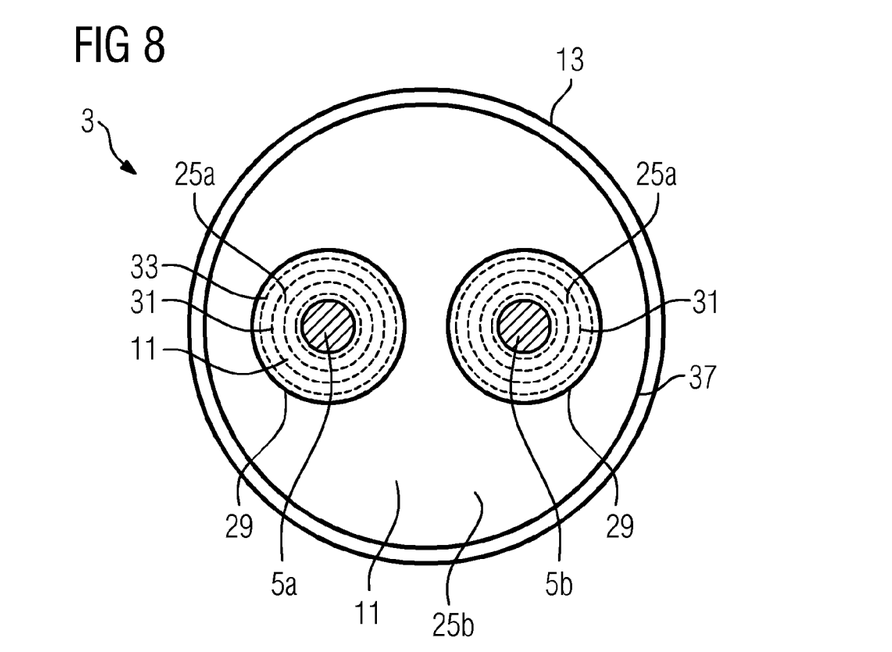
FIG. 8 shows a schematic cross section through a transmission line according to an eighth exemplary embodiment.

FIG. 8 shows a schematic cross section through a line 3 according to an eighth exemplary embodiment. Said figure shows a two-pole line having two superconducting conductor elements 5a and 5b. However, in contrast to the fourth exemplary embodiment, each of the two conductor elements 5a and 5b is provided with a dedicated line shield 29 and arranged together with said dedicated line shield within a common coolant channel 25b here. Said common coolant channel 25b is, for its part, surrounded by a common outer vacuum-insulated sleeve 13 which, however, does not act as a primary line shield, in other words does not act as the innermost line shield, in this example. In some embodiments, a dedicated dielectric insulation layer 31 with an annular cross section is arranged between the individual conductor elements 5 and the respective line shield 29.

In some embodiments, said insulation layers 31 may concentrically surround the associated conductor element 5a or 5b. In this exemplary embodiment, each of the two insulation layers 31 comprises a multilayer arrangement 33 of a laminate which is composed of PPLP which is respectively embedded in an inner coolant channel 25a. Fluid coolant 11 likewise flows in said two inner coolant channels and, in the process, flows around the paper layer 33. Therefore, in this example, the dielectric insulation layer 31 of the respective conductor runs is not almost complete, but rather only formed in portions from the flowing coolant. The remaining portion is provided by the paper layers 33 which at the same time constitute a supporting structure for the conductor element 5a or 5b which is respectively arranged on the inside. The flow direction of the coolant in the inner coolant channels 25a on the one hand and in the common outer coolant channel on the other hand can advantageously oppose one another in the transmission line according to FIG. 8 too. By way of example, a line of this kind can then be used in a device in a similar manner to that shown in FIGS. 6 and 7.

Figure 9:
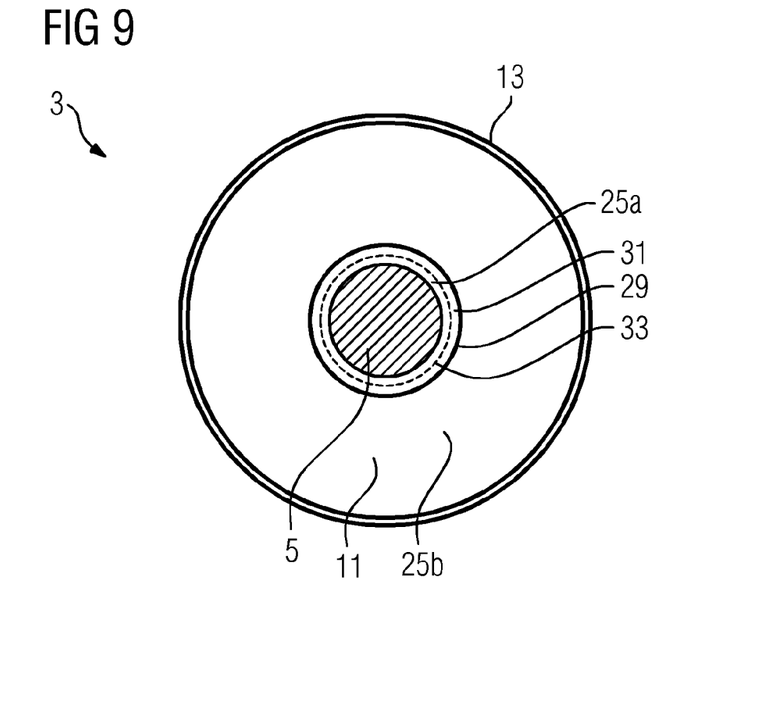
FIG. 9 shows a schematic cross section through a transmission line according to a ninth exemplary embodiment.

FIG. 9 shows a schematic cross section through a single-pole transmission line 3 according to a ninth exemplary embodiment. The construction of said line 3 includes only one superconducting conductor element 5 arranged radially in the center of the line. The conductor element 5 is surrounded by a dielectric insulation layer 31 here too, said dielectric insulation layer being formed by interaction of an arrangement of paper layers 33 and a fluid coolant 11 flowing around said paper layers 33 in an inner coolant channel 25a. A line shield 29 surrounds the dielectric insulation layer 31 and is arranged radially outside said dielectric insulation layer and is surrounded by an outer coolant channel 25b and yet further on the outside by a vacuum-insulated sleeve 13.

Figure 10:
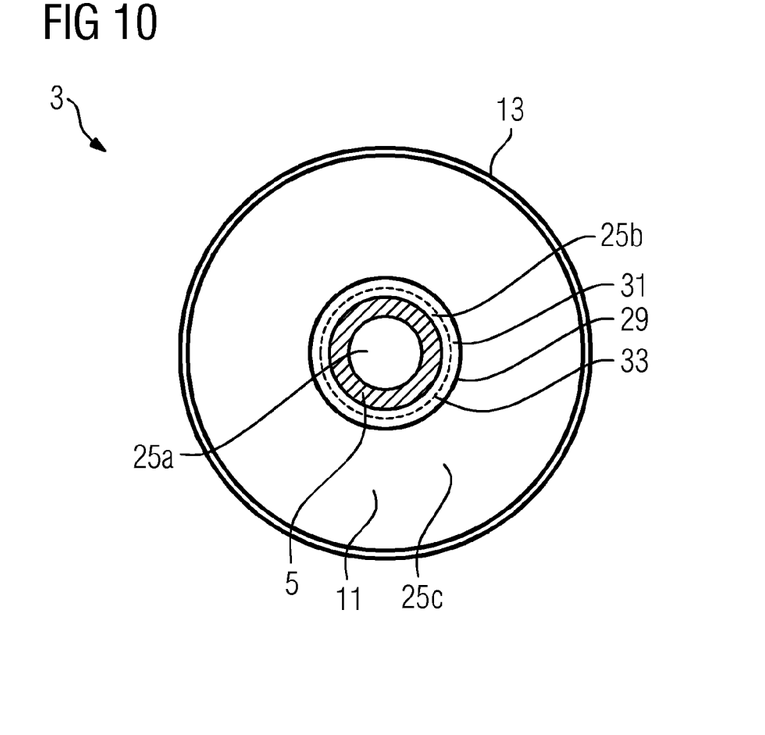
FIG. 10 shows a schematic cross section through a transmission line according to a tenth exemplary embodiment.

FIG. 10 shows a schematic cross section through a single-pole line 3 according to a tenth exemplary embodiment. The relative arrangement of conductor element 5, dielectric insulation layer 31 and line shield 29 is similar to that in the ninth exemplary embodiment. The construction of the dielectric insulation layer 31 may include a combination of paper layers and flowing coolant in a similar manner to that in the previous example. However, in contrast to the previous embodiment, an additional coolant channel is arranged in the interior of the conductor element 5 here. Therefore, there is a total of three coolant channels here, the first 25a of which is arranged in the center of the line, the second 25b of which is lined with paper layers 33 and radially surrounds the conductor element 5, and the third 25c of which is arranged radially between the line shield 29 and the vacuum-insulated sleeve 13. The flow directions in the interleaved coolant channels can change in an alternating manner. A similar construction to that in FIG. 10 is also conceivable for a two-pole line in principle, an additional coolant channel passing through the inside of each conductor element in the case of said construction.

Figure 11:
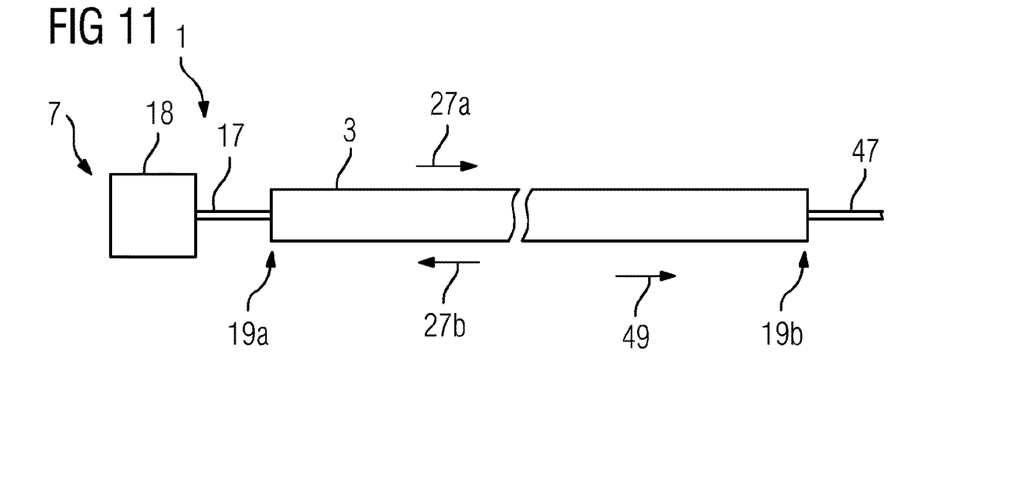
FIG. 11 shows a basic diagram of a device for current transmission according to an eleventh exemplary embodiment.

FIG. 11 shows a basic diagram of a device for DC transmission according to an eleventh exemplary embodiment. Said figure shows a device with only one single transmission line 3 which can be constructed, for example, according to one of the various line cross sections shown. Therefore, said line may include single- or two-pole design and one or more coolant channels. The cooling device 7 for cooling the at least one conductor element has at least one feed device 18 at an end region 19a of the line. In some embodiments, however, there can also be a feed device at both end regions.

It the embodiment shown, a net mass transport of the coolant takes place along a longitudinal direction of the line. In the example shown, said mass transport is mass transport along a first flow direction 27a from the first end region 19a toward the second end region 19b of the line. In addition, simultaneous mass transport can also take place in the opposite flow direction 27b but, in the example shown, this is less than the mass transport in the first flow direction 27a. In other words, the device for DC transmission can be used to transmit coolant along the line 3 at the same time. In particular, the first flow direction 27a which is critical for mass transport can be the same as the transmission direction 49 of the electrical energy. This may transport both electrical energy and also hydrogen generated by electrolysis from one location, at which a large amount of energy is available, to another location.

Figure 12:
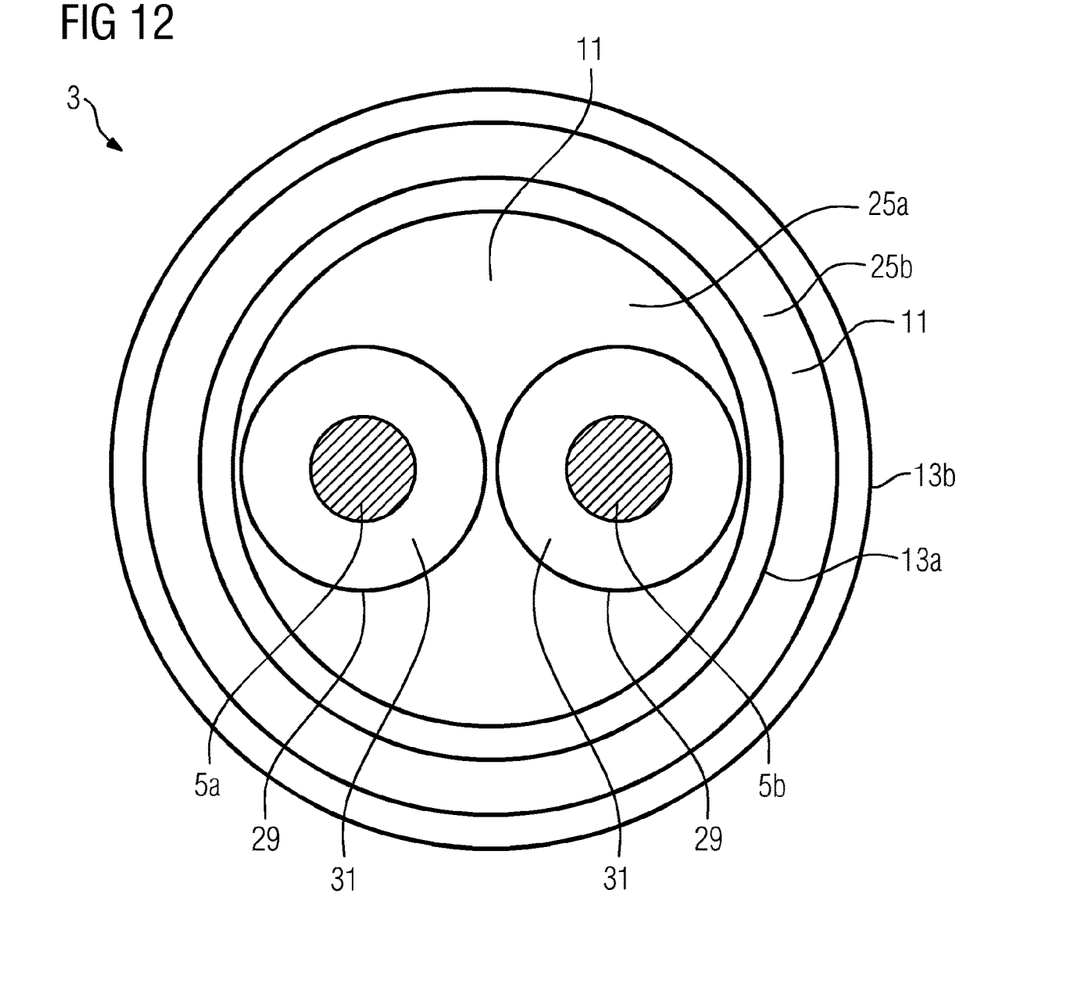
FIG. 12 shows a schematic cross section through a transmission line according to a twelfth exemplary embodiment.

FIG. 12 shows a schematic cross section through a further transmission line 3 according to a twelfth exemplary embodiment. Said figure shows a two-pole line having two conductor elements 5a and 5b which, in a similar manner to that shown in FIG. 5, has two concentric vacuum-insulated sleeves 13a and 13b, wherein an inner coolant channel 25a is arranged within the inner sleeve 13a and an outer coolant channel 25b is arranged between the two sleeves. In contrast to the exemplary embodiments of the line cross sections shown above, the two conductor elements are each electrically insulated from their respective innermost line shields 29 by solid-body dielectrics as the insulation layer 31. The inner coolant channel 25a jointly surrounds said two line runs which are insulated and shielded in this way. A high degree of thermal and electrical shielding of the conductor elements can also be achieved with a construction of this kind owing to the interleaved arrangement of cooling channels and vacuum-insulated sleeves.

What is claimed is:

1. A device for DC transmission, the device comprising:
    a superconducting transmission line including a solid cylindrical superconducting conductor element; and
    a coolant channel for cooling an inner region of the transmission line with a fluid coolant to a temperature below a critical temperature of the solid cylindrical superconducting conductor element, the solid cylindrical superconducting conductor element centered in the coolant channel;
    wherein the superconducting transmission line comprises a vacuum-insulated sleeve thermally isolating the inner region of the transmission line from a warmer outer surrounding area;
    a feed device feeding the fluid coolant at an end region of the transmission line into the coolant channel; and
    at least one layer of a polypropylene-laminated paper disposed in the coolant channel, wherein the fluid coolant flows both inside and outside the at least one layer;
    wherein the transmission line is free of internally arranged feed devices for feeding coolant at locations away from the end region.

2. The device as claimed in claim 1, wherein the transmission line comprises:
    an electrically conductive line shield surrounding the superconducting conductor element; and
    an annular dielectric insulation layer between the superconducting conductor element and the line shield;
    wherein the dielectric insulation layer comprises the fluid coolant.

3. The device as claimed in claim 2, wherein the dielectric insulation layer has a breakdown strength of at least 20 kV/mm.

4. The device as claimed in claim 1, wherein the coolant channel comprises a smooth-walled tube over at least a majority of a longitudinal extent of the transmission line.

5. The device as claimed in claim 1, wherein the superconducting conductor element comprises a high-temperature superconducting material.

6. The device as claimed in claim 5, wherein the high-temperature superconducting material comprises magnesium diboride.

7. The device as claimed in claim 1, further comprising only one feed device for feeding coolant at one of the end regions of the transmission line.

8. The device as claimed in claim 1, wherein the transmission line comprises two fluidically isolated coolant channels for transporting the fluid coolant in opposite directions.

9. The device as claimed in claim 1, wherein the transmission line comprises two coolant channels running coaxially in relation to one another.

10. The device as claimed in claim 1, wherein the fluid coolant comprises at least one chosen from the group consisting of: nitrogen, hydrogen, helium, and neon.

11. A device for DC transmission, the device comprising:
    a superconducting transmission line including two solid cylindrical superconducting conductor elements; and
    a coolant channel for cooling an inner region of the transmission line with a fluid coolant to a temperature below a critical temperature of the solid cylindrical superconducting conductor element, the coolant channel surrounding the two solid cylindrical superconducting conductor elements;
    wherein the superconducting transmission line comprises a vacuum-insulated sleeve thermally isolating the inner region of the transmission line from a warmer outer surrounding area;
    wherein the two solid cylindrical superconducting conductor elements are disposed opposite from one another across a central axis of the coolant channel and separated from walls of the inner region of the transmission line defining the coolant channel;
    a feed device feeding the fluid coolant at an end region of the transmission line into the coolant channel; and
    at least one layer of a polypropylene-laminated paper disposed in the coolant channel, wherein the fluid coolant flows both inside and outside the at least one layer;
    wherein the transmission line is free of internally arranged feed devices for feeding coolant at locations away from the end region.

12. The device as claimed in claim 11, wherein the transmission line comprises:
    an electrically conductive line shield surrounding the superconducting conductor element; and
    an annular dielectric insulation layer between the superconducting conductor element and the line shield;
    wherein the dielectric insulation layer comprises the fluid coolant.

13. The device as claimed in claim 11, wherein the coolant channel comprises a smooth-walled tube over at least a majority of a longitudinal extent of the transmission line.

14. The device as claimed in claim 11, wherein the superconducting conductor element comprises a high-temperature superconducting material.

15. The device as claimed in claim 11, wherein the superconducting conductor element comprises magnesium diboride.

16. The device as claimed in claim 11, further comprising only one feed device for feeding coolant at one of the end regions of the transmission line.

17. The device as claimed in claim 11, wherein the transmission line comprises two fluidically isolated coolant channels for transporting the fluid coolant in opposite directions.

18. The device as claimed in claim 11, wherein the transmission line comprises a two-pole line with the two superconducting conductor elements electrically insulated from one another within a common vacuum-insulated sleeve.

19. The device as claimed in claim 11, wherein the transmission line comprises two coolant channels running coaxially in relation to one another.

20. The device as claimed in claim 11, wherein the fluid coolant comprises at least one chosen from the group consisting of: nitrogen, hydrogen, helium, and neon.

* * * * *